(12) United States Patent
Yamaji

(10) Patent No.: US 9,136,326 B2
(45) Date of Patent: Sep. 15, 2015

(54) SEMICONDUCTOR DEVICE WITH INCREASED ESD RESISTANCE AND MANUFACTURING METHOD THEREOF

(71) Applicant: FUJI ELECTRIC CO., LTD., Kawasaki-shi (JP)

(72) Inventor: Masaharu Yamaji, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/156,549

(22) Filed: Jan. 16, 2014

(65) Prior Publication Data

US 2014/0197491 A1 Jul. 17, 2014

(30) Foreign Application Priority Data

Jan. 17, 2013 (JP) ................................. 2013-006171

(51) Int. Cl.
*H01L 29/06* (2006.01)
*H01L 29/66* (2006.01)
*H01L 29/78* (2006.01)
*H01L 21/266* (2006.01)

(52) U.S. Cl.
CPC .......... *H01L 29/0646* (2013.01); *H01L 21/266* (2013.01); *H01L 29/66477* (2013.01); *H01L 29/78* (2013.01)

(58) Field of Classification Search
CPC ................ H01L 29/78; H01L 29/0646; H01L 29/66477; H01L 21/266
USPC .......................................................... 257/438
See application file for complete search history.

(56) References Cited

U.S. PATENT DOCUMENTS

| 5,515,319 A | * | 5/1996 | Smayling et al. ......... 365/185.27 |
| 5,691,550 A | * | 11/1997 | Kohyama ...................... 257/301 |
| 6,531,356 B1 | * | 3/2003 | Hayashi ........................ 438/228 |
| 7,102,194 B2 | * | 9/2006 | Huang et al. .................. 257/341 |

(Continued)

FOREIGN PATENT DOCUMENTS

| JP | 11-111855 A | 4/1999 |
| JP | 2002-094063 A | 3/2002 |
| JP | 2012-519371 A | 8/2012 |

OTHER PUBLICATIONS

Kozo Kinoshita, et al. "A New Adaptive Resurf Concept for 20 V LDMOS Without Breakdown Voltage Degradation at High Current" Proceedings of 1998 International Symposium on Power Semiconductor Devices & IC, Kyoto.

*Primary Examiner* — William Coleman
(74) *Attorney, Agent, or Firm* — Rossi, Kimms & McDowell LLP

(57) ABSTRACT

A semiconductor device and manufacturing method are disclosed which provide increased ESD resistance. By disposing a slit mask when forming a second p-type well layer, impurity concentration of the second p-type well layer is partially reduced. By forming a second n-type offset layer in the second p-type well layer having decreased impurity concentration, it is possible to increase thickness of the second n-type offset layer in this place compared with that heretofore known. By increasing thickness of the second n-type offset layer, a depletion layer does not reach an n-type drain layer at a low voltage when reverse bias is applied to the drain. It thus is possible to prevent thermal destruction caused by localized electrical field concentration. As a result, it is possible to increase ESD resistance. As it is sufficient to replace a photoresist mask, there is no increase in the number of processes.

9 Claims, 13 Drawing Sheets

(56) References Cited

U.S. PATENT DOCUMENTS

| | | |
|---|---|---|
| 2002/0030238 A1 | 3/2002 | Nakamura et al. |
| 2004/0075147 A1* | 4/2004 | Ueda et al. .................. 257/368 |
| 2006/0033156 A1* | 2/2006 | Huang et al. ................ 257/335 |
| 2008/0029814 A1* | 2/2008 | Khalil .......................... 257/339 |
| 2008/0061367 A1* | 3/2008 | Williams et al. ............. 257/336 |
| 2012/0235712 A1 | 9/2012 | Yamaji |
| 2013/0001736 A1* | 1/2013 | Yamaji ......................... 257/499 |

* cited by examiner

SEMICONDUCTOR DEVICE WITH INCREASED ESD RESISTANCE AND MANUFACTURING METHOD THEREOF

BACKGROUND OF THE INVENTION

A. Field of the Invention

The present invention relates to a semiconductor device and manufacturing method applied to, for example, a drive circuit having a floating potential as a reference.

B. Description of the Related Art

Power devices such as insulated gate bipolar transistors (IGBT) or power metal-oxide-semiconductor field-effect transistors (MOSFET) are utilized in many fields, such as motor controlling inverters, plasma display panels (PDP), power supply applications for flat panel displays (FPD) such as liquid crystal panels, and inverters for household electrical appliances such as air conditioners and lighting.

To date, an electronic circuit configured by combining semiconductor devices such as a photocoupler and electronic parts such as a transformer has been used for the drive and control of these power devices. In recent years, however, high breakdown voltage ICs of breakdown voltage classes from 200V to 1,200V used in a range from household power supplies of 100V and 200V AC to industrial power supplies of 400V AC, and the like have been put to practical use, owing to the advance in large scale integration (LSI) technology.

There are a wide variety of high breakdown voltage ICs, encompassing gate driver ICs incorporating a high side gate driver and low side gate driver that control a power device, products incorporating overheat protection and overcurrent protection functions, and furthermore, single chip inverter ICs wherein a control circuit and power device are integrated on the same semiconductor substrate, and the like. The high breakdown voltage IC contributes greatly to a reduction in size and increase in efficiency of an overall inverter system owing to a reduction in the number of parts on a mounting board.

Generally, a high breakdown voltage IC is such that high side and low side drive logic devices are incorporated inside an IC. These logic devices are an n-type channel MOSFET and p-type channel MOSFET with a source-to-drain breakdown voltage of in the region of 20 to 30V, and are also used in a drive circuit.

Normally, as well as the n-type channel MOSFET and p-type channel MOSFET, a protection element such as a diode for electric static discharge (ESD) protection is connected in parallel to an input/output (I/O) terminal in the high voltage breakdown IC between a power supply terminal and ground terminal or between a high side power supply terminal and high side potential reference terminal.

Electrostatic destruction of a semiconductor device due to ESD refers to a destruction phenomenon whereby IC or LSI gate oxide film destruction or diffusion layer junction destruction, fusion of aluminum wiring, or the like, is caused by static electricity. When expressed as voltage, the static electricity often reaches a voltage of several hundred volts to several thousand volts, and when this kind of high voltage is applied to an input/output terminal of an IC or the like, an internal circuit, wiring, or the like of the IC may be destroyed.

As the n-type channel MOSFET and p-type channel MOSFET are of a push-pull configuration, there is rarely a problem of ESD surge destruction with regard to a driver circuit output terminal, or the like, in a high breakdown voltage IC. However, in the case of a high breakdown voltage IC incorporating a protection function such as abnormality detection, or the like, it is often the case that an n-type channel MOSFET with an open drain configuration, or the like, is used for an abnormal current detection output terminal in order to input a signal into an external personal computer, or the like, at a low voltage.

In the case of the open drain n-type channel MOSFET, as there is no body diode (built-in diode) path to the power supply side in a p-type channel MOSFET, it is often the case that the n-type channel MOSFET itself causes junction destruction due to ESD surge, power supply noise, or the like. Because of this, it is necessary to provide an ESD protection diode, or the like, over a large area in the abnormal current detection output terminal, or the like, and there is a cost-related problem in that chip size increases because of an increase in protection element area in a sophisticated IC. Also, an n-type channel MOSFET on a high side well used in a power IC, particularly in a high breakdown voltage IC incorporating a high side triple well structure, is such that ESD resistance is liable to decrease, and there is a problem in that an ESD protection diode with a large area is necessary in order to prevent this decrease.

FIGS. 10A and 10B are diagrams illustrating a heretofore known semiconductor device 500, wherein FIG. 10A is a main portion sectional view, and FIG. 10B is an enlargement of a B portion of FIG. 10A showing depletion layer 80 inside second n-type offset layer 67. The semiconductor device is a high side n-type channel MOSFET 501 of a triple well structure.

High side n-type channel MOSFET 501 has a high side n-type channel MOSFET of a triple well structure (configured of first p-type well layer 53, and n-type well layer 52 and second p-type well layer 60 shown in the drawings). FIGS. 10A and 10B are main portion sectional views of the high side n-type channel MOSFET with the triple well structure.

N-type channel MOSFET 501 configuring semiconductor device 500 includes first p-type well layer 53 and n-type well layer 52 disposed in a surface layer of p-type semiconductor substrate 51, and second p-type well layer 60 formed by diffusion in a surface layer of n-type well layer 52. First p-type well layer 53 includes in a surface layer contact layer 75 for applying a predetermined potential to p-type semiconductor substrate 51.

Also, n-type channel MOSFET 501 includes first n-type offset layer 66 and second n-type offset layer 67 selectively formed by diffusion to be distanced from each other in a surface layer of second p-type well layer 60, n-type drain layer 72 formed by diffusion in a surface layer of second n-type offset layer 67, and n-type source layer 73 formed by diffusion in a surface layer of first n-type offset layer 66. Also, n-type channel MOSFET 501 includes p-type base layer 71, in contact with first n-type offset layer 67 and connected to second p-type well layer 60, and p-type contact layer 74 in contact with p-type base layer 71 and n-type source layer 73.

Also, a LOCOS oxide film (hereafter abbreviated to LOCOS 68) is provided on second n-type offset layer 67, second p-type well layer 60, n-type well layer 52, and p-type semiconductor substrate 51.

Also, thick gate oxide film 69 is provided on p-type well layer 60 sandwiched by first n-type offset layer 66 and second n-type offset layer 67, and gate electrode 70 is provided extending from thick gate oxide film 69 to LOCOS 68.

Also, n-type channel MOSFET 501 includes a drain electrode (not shown) connected to n-type drain layer 72 and a source electrode (not shown) connected to n-type source layer 73 and p-type contact layer 74.

Second p-type well layer 60 disposed below gate electrode 70 forms a back gate region.

As shown in FIGS. 11A and 11B, to be described hereafter, n-type channel MOSFET 501 is such that the surface of second p-type well layer 60 formed on n-type well layer 52 below LOCOS 68 and below thick gate oxide film 69 is locally of a low concentration. This is because of the out-diffusion (drawing out) effect of boron impurities when carrying out a pyro-oxidation step.

However, as LOCOS 68 is not formed on the surface of second p-type well layer 60 below n-type drain layer 72, there is no out-diffusion effect. Because of this, the boron concentration is high compared with that below LOCOS 68 and thick gate oxide film 69.

FIGS. 11A and 11B are diagrams showing the relationship between impurity concentration and depth, wherein FIG. 11A is a diagram illustrating second p-type well layer 60, and FIG. 11B is a diagram illustrating second n-type offset layer 67. In FIG. 11A, the boron concentration below LOCOS 68 decreases farther than that below n-type drain layer 72 owing to out-diffusion (drawing out). In other words, the boron concentration of region 61 below n-type drain layer 72 is higher than the boron concentration of region 62 below LOCOS 68. Meanwhile, as boron impurities are absorbed by LOCOS 68 on the surface, the boron concentration of second p-type well layer 60 in a junction place Q with n-type well layer 52 is the same in both regions.

Because of this, second n-type offset layer 67 formed as a drain drift region of n-type channel MOSFET 501 is such that a thickness T1 below LOCOS 68 is large, while a thickness To below n-type drain layer 72 is small, as shown in FIG. 11B. As a result of this, the thickness To of second n-type offset layer 67 below n-type drain layer 72 is small at less than 1 μm in the heretofore known structure. When an ESD surge is applied to the drain, second n-type offset layer 67 is depleted from a junction portion between second p-type well layer 60 and second n-type offset layer 67. The depletion process is such that, as the thickness To of second n-type offset layer 67 below n-type drain layer 72 is small at less than 1 μm, depletion layer 80 spreads at a low reverse voltage, and depletion layer 80 reaches n-type drain layer 72, causing a localized electrical field concentration (the mark × in FIGS. 10A and 10B). As a result of this, when an ESD surge is applied to the drain, an electrical field concentration is caused below n-type drain layer 72, leading to junction destruction at a low ESD applied voltage of in the region of, for example, 1,700V.

FIG. 12 is a diagram showing the relationship between the drain voltage and drain current when an ESD surge is input into the drain of the n-type channel MOSFET 501 with the heretofore known high side structure. The diagram shows the appearance of a snapback waveform after avalanche breakdown.

As second n-type offset layer 67 below n-type drain layer 72 is shallow in n-type channel MOSFET 501 of FIGS. 10A and 10B, an electrical field concentrates in the junction portion of second n-type offset layer 67 and second p-type well layer 60, and the breakdown voltage decreases. Furthermore, as second n-type offset layer 67 below n-type drain layer 72 is completely depleted, second n-type offset layer 67 becomes a negative resistor after snapback, and localized current concentration occurs, as shown in FIG. 12. Because of this, the ESD resistance decreases.

To date, in order to increase the ESD resistance of a MOSFET used as a driver element of a power IC or the like, it has been important to alleviate an electrical field at the drain end, thereby avoiding a localized current concentration, when an ESD surge is input into the drain. In order to do this, an additional buffer layer is introduced into the drain so that the depletion layer does not reach the n-type drain layer, as in "A New Adaptive Resurf Concept for 20V LDMOS Without Breakdown Voltage Degradation at High Current", ISPSD, 1998 (Kyoto) pages 65 to 68.

As a way of doing this, there is an employment of an adaptive resurf (buffer) structure that suppresses a change to negative resistance after avalanche, an adopting of a thyristor structure by adding a p+ anode layer on the drain side, as in JP-A-2002-94063, and the like.

In "A New Adaptive Resurf Concept for 20V LDMOS Without Breakdown Voltage Degradation at High Current", ISPSD, 1998 (Kyoto) pages 65 to 68, by introducing an additional buffer layer in the drain of an LDMOS so that the depletion layer does not reach the n-type drain layer when there is reverse bias, the buffer layer portion is caused to function as a resistance component. Because of this, a localized current concentration occurring after avalanche is suppressed by the resistance component, and it is possible to cause current to flow evenly through the whole of the cell, because of which the ESD resistance per unit element area increases.

Also, in JP-A-2002-94063, avalanche breakdown occurs in an end portion on the LOCOS oxide film side of the drain layer, because of which electrons and holes are generated. The electrons generated flow into the drain layer, while the holes flow into a back gate layer. At this time, a parasitic bipolar transistor formed of the n-type drain layer, p-type base (back gate) layer, and n-type source layer changes to an on-state. By the parasitic bipolar transistor changing to an on-state, the voltage between the source layer and drain layer is clamped at a low voltage, and the ESD surge voltage is suppressed.

However, when a localized current concentration occurs in the end portion of the drain layer, thermal runaway occurs in this region. Because of this, sufficient ESD resistance is not obtained, and junction destruction may occur in the drain layer. In order to prevent this destruction, holes are implanted from the p+ anode layer after the parasitic bipolar transistor changes to an on-state by adding a p+ anode layer on the drain side, and there is a shift to a thyristor action, reducing the hold voltage and suppressing current concentration.

However, in "A New Adaptive Resurf Concept for 20V LDMOS Without Breakdown Voltage Degradation at High Current", ISPSD, 1998 (Kyoto) pages 65 to 68 and in JP-A-2002-94063, it is necessary to add a buffer layer on the drain side, or necessary to add a deep p+ anode layer, in order to increase the ESD resistance of the LDMOS. Because of this, the number of processes increases owing to patterning and ion implantation steps using a dedicated mask, leading to an increase in cost.

Also, when attempting to apply the previously described measures to the high side region of a triple well structure, it is necessary to configure a high side n-type channel MOSFET by forming a well layer, which forms a back gate region on an n-type well layer forming a high side high potential layer, and an n-type offset layer that forms a source-to-drain layer. However, when forming the adaptive resurf (buffer) layer more deeply than the drain side n-type offset layer, a problem occurs in that punch-through breakdown voltage between the adaptive resurf (buffer) layer and high potential n-type well layer decreases. Also, with regard to the addition of a p+ anode layer on the drain side, application is difficult as it leads to a decrease in punch-through or junction breakdown voltage occurring between the p-type well layer on the high side n-type well layer and the p+ anode layer disposed on the n-type offset layer. In either case, no description or suggestion of improving the ESD resistance in a high side logic device with a triple well structure is found in "A New Adaptive Resurf Concept for 20V LDMOS Without Breakdown Voltage Degradation at High Current", ISPSD, 1998 (Kyoto) pages 65 to 68 or in JP-A-2002-94063.

Next, a description will be given of JP-A-11-111855. In JP-A-11-111855, a photomask having a mask pattern with widely differing ion implantation areas is used. It is described that, by an opening portion with no photoresist being formed in a region that is to form a high concentration p-type well region, and an opening portion in which photoresist remains in slit form being formed in a region that is to form a low concentration p-type well region, using the photomask, and an ion implantation being carried out, a condensing of steps and a reduction in chip cost are achieved.

However, the photoresist opening portion for forming the high concentration p-type well region and the photoresist opening portion for forming the low concentration p-type well region are separated into two regions, and each is formed as a separate well region. Because of this, the slit form resist opening portion is not provided in one portion in the same p-type well region.

Also, in JP-T-2012-519371 (the term "JP-T" as used herein means a published Japanese translation of a PCT patent application), a high breakdown voltage semiconductor device includes an $n^-$ type region, provided on a $p^-$ type silicon substrate and enclosed by a $p^-$ type well region, and a drain $n^+$ type region connected to a drain electrode. The high breakdown voltage semiconductor device includes a p-type base region, provided distanced from the drain $n^+$ type region and enclosing the drain $n^+$ type region, and a source $n^+$ type region formed inside the p-type base region. Also, a $p^-$ type region penetrating the $n^-$ type region and reaching the silicon substrate is provided. The $n^-$ type region is divided in two by the $p^-$ type region. One $n^-$ type region includes the drain $n^+$ type region. The other $n^-$ type region has a floating potential. It is described that the high breakdown voltage semiconductor device is adopted as a high breakdown voltage transistor with high switching response speed and a drive circuit that suppresses power loss and malfunction.

SUMMARY OF THE INVENTION

The present invention provides a semiconductor device and manufacturing method thereof such that it is possible to increase the ESD resistance of a MOSFET using the previously described heretofore known technology.

According to a first aspect of the invention, a semiconductor device includes a second conductivity type well layer disposed on or in a surface layer of a first conductivity type semiconductor substrate, a first conductivity type second well layer selectively disposed in a surface layer of the second conductivity type well layer, a second conductivity type first offset layer and second conductivity type second offset layer disposed distanced in a surface layer of the first conductivity type second well layer, a second conductivity type high concentration layer, with an impurity concentration higher than that of the second offset layer, disposed in a surface layer of the second offset layer, and a LOCOS oxide film disposed so as to enclose the high concentration layer, wherein the diffusion depth of the second well layer below the high concentration layer is less than the diffusion depth of the second well layer below the LOCOS oxide film.

According to a second aspect of the invention, a semiconductor device includes a first conductivity type well layer and second conductivity type well layer disposed on a first conductivity type semiconductor substrate, a first conductivity type second well layer selectively disposed in a surface layer of the second conductivity type well layer, a second conductivity type first offset layer and second conductivity type second offset layer disposed distanced in a surface layer of the first conductivity type second well layer, a second conductivity type source layer disposed in a surface layer of the first offset layer, a second conductivity type drain layer disposed in a surface layer of the second offset layer, a first conductivity type semiconductor layer disposed in contact with the source layer in a surface layer of the second well layer on the side opposite to that of the second offset layer, a gate electrode disposed across a gate dielectric on the second well layer sandwiched by the first offset layer and second offset layer, and a LOCOS oxide film, disposed so as to enclose the drain layer, disposed in contact with the gate dielectric, wherein the second well layer is such that a bottom portion below the high concentration drain layer includes a region shallower than a bottom portion below the LOCOS oxide film.

According to a third aspect of the invention, it is good when the semiconductor device according to the first or second aspect is such that the thickness of the second offset layer between the second well layer and high concentration drain layer is 0.8 μm or more.

According to a fourth aspect of the invention, a method of manufacturing a semiconductor device including a first conductivity type well layer and second conductivity type well layer disposed on a first conductivity type semiconductor substrate and a first conductivity type second well layer selectively disposed in a surface layer of the second conductivity type well layer includes a step of forming the first conductivity type well layer and second conductivity type well layer on or in a surface layer of the first conductivity type semiconductor substrate, a step of ion implanting first conductivity type impurities using a photoresist mask including a first opening portion and a second opening portion enclosed by the first opening portion or formed so as to divide the first opening portion, and subsequently carrying out a drive-in process, thereby forming the second well layer including a region wherein the depth of a region corresponding to the second opening portion is less than the depth of a region corresponding to the first opening portion, a step of forming a second conductivity type first offset layer in a surface layer of the second well layer, a step of forming a second conductivity type second offset layer distanced from the first offset layer on a region of the second well layer with a small depth, a step of forming a LOCOS oxide film including a third opening portion on the second offset layer, a step of forming a gate dielectric so as to be in contact with the LOCOS oxide film on the second well layer sandwiched by the first offset layer and second offset layer and on the second offset layer, a step of forming a gate electrode on the gate dielectric, a step of forming a second conductivity type source layer in a surface layer of the first offset layer, a step of ion implanting second conductivity type impurities into a surface layer of the second offset layer with the LOCOS oxide film as a mask, and carrying out a drive-in process, thereby forming a second conductivity type drain layer, a step of forming a first conductivity type semiconductor layer in contact with the second well layer from the first offset layer surface, and a step of forming a source electrode electrically connected to the source layer and semiconductor layer and a drain electrode electrically connected to the drain layer.

According to a fifth aspect of the invention, it is good when the semiconductor device manufacturing method according to the fourth aspect is such that the impurities are boron.

According to a sixth aspect of the invention, it is good when the semiconductor device manufacturing method according to the fourth aspect is such that the area of the second opening portion is regulated so as to bring the impurity concentration of the second well layer below the drain layer near to the impurity concentration of the second well layer below the LOCOS oxide film.

According to a seventh aspect of the invention, it is good when the semiconductor device manufacturing method according to the fourth aspect is such that the first offset layer and second offset layer are formed simultaneously by an ion implantation of phosphorus impurities and a drive-in process.

According to an eighth aspect of the invention, it is good when the semiconductor device manufacturing method according to the fourth aspect is such that the first conductivity type well layer or second conductivity type well layer is formed of an epitaxial layer, while the second conductivity type well layer or first conductivity type well layer is formed by diffusion.

According to the invention, it is possible to provide a semiconductor device and manufacturing method thereof such that it is possible to increase ESD resistance. As the ESD resistance of a MOSFET increases, there is no need to carry out a wasteful increase in MOS size, or the like, for the sake of adding a protective element or maintaining resistance, and it is thus possible to reduce the chip size. Also, it is possible to provide a semiconductor device manufacturing method such that it is possible to suppress an increase in the number of processes, and increase the ESD resistance of a MOSFET.

BRIEF DESCRIPTION OF THE DRAWINGS

The foregoing advantages and features of the invention will become apparent upon reference to the following detailed description and the accompanying drawings, of which:

FIGS. 1A to 1C are diagrams illustrating a semiconductor device 100 according to a first example of the invention, wherein FIG. 1A is a main portion sectional view, FIG. 1B is an enlargement of an A portion of FIG. 1A, and FIG. 1C is a diagram showing a depletion layer spreading inside a second n-type offset layer;

FIGS. 2A and 2B are diagrams showing the relationship between the impurity concentration and depth of each layer along Y1-Y1 and Y2-Y2 of FIG. 1B, wherein FIG. 2A is a diagram illustrating the depth of a second p-type well layer 10, and FIG. 2B is a diagram illustrating a thickness T of the second n-type offset layer 17;

FIGS. 7A to 7C are diagrams showing the relationship between the impurity concentration and depth of each layer, wherein FIG. 7A is a diagram in the case of a second p-type well layer 60, and FIG. 7B is a diagram of a second n-type offset layer 67;

FIGS. 8A to 8C are diagrams of a slit mask 5, wherein FIG. 8A is a plan view of the slit mask 5 wherein both an opening portion 5a and non-opening portion 5b are of a stripe form, FIG. 8B is a sectional view cut along an X-X line of FIG. 8A, and FIG. 8C is a plan view of the slit mask 5 wherein the non-opening portion 5b is of a lattice form and the opening portion 5a of a quadrilateral form;

FIGS. 10A and 10B are diagrams illustrating a heretofore known semiconductor device 500, wherein FIG. 10A is a main portion sectional view, and FIG. 10B is an enlargement of a B portion of FIG. 10A showing a depletion layer 80 inside a second n-type offset layer 67;

FIGS. 11A and 11B are diagrams showing the relationship between impurity concentration and depth, wherein FIG. 11A is a diagram illustrating a second p-type well layer 60, and FIG. 11B is a diagram illustrating the second n-type offset layer 67;

FIGS. 14A and 14B are diagrams showing an example of a semiconductor device 200 including the n-type channel MOSFET 101 configuring a high side drive circuit 803 shown in FIG. 13, wherein FIG. 14A is a main portion plan view, and FIG. 14B is a main portion sectional view along a Z-Z line of FIG. 14A.

DETAILED DESCRIPTION OF SPECIFIC EMBODIMENTS

An embodiment will be described using the following examples.

Example 1

Figure 1A:
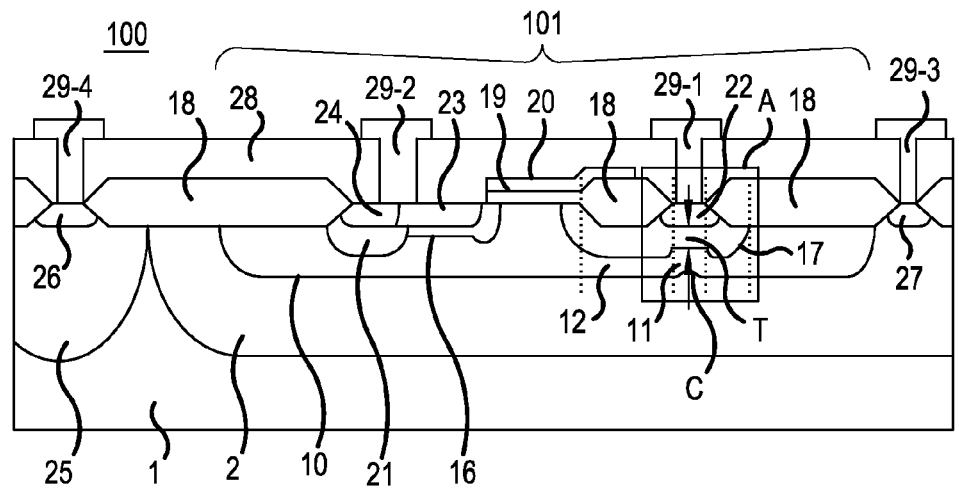
Figure 1B:
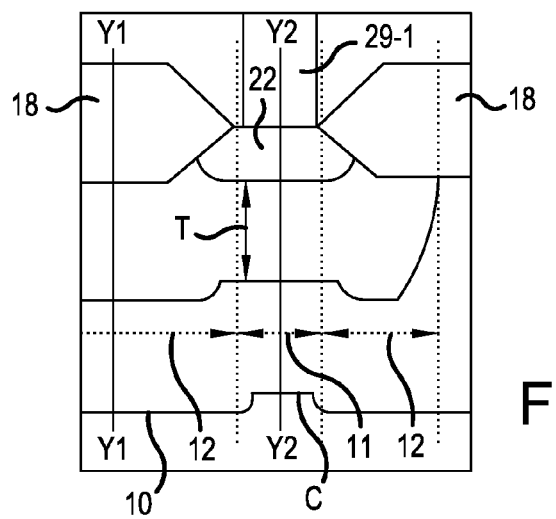
Figure 1C:
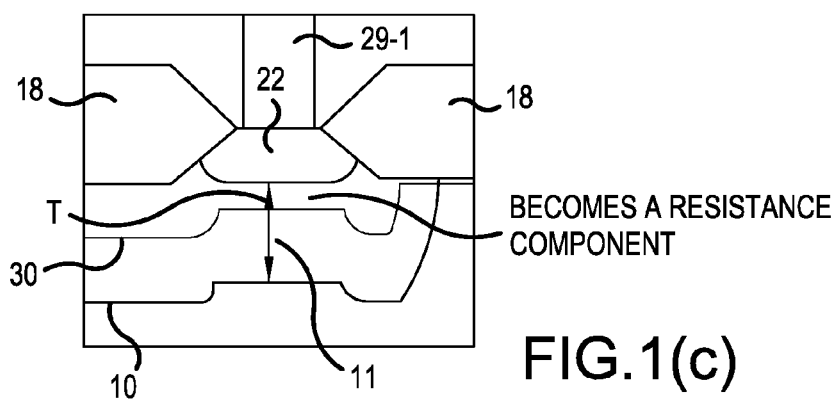

FIGS. 1A to 1C are diagrams illustrating semiconductor device 100 according to a first example of the invention, wherein FIG. 1A is a main portion sectional view, FIG. 1B is an enlargement of an A portion of FIG. 1A, and FIG. 1C is a diagram showing a depletion layer spreading inside second n-type offset layer 17. Semiconductor device 100 has n-type channel MOSFET 101 of a triple well structure (configured of first p-type well layer 25, n-type well layer 2, and second p-type well layer 10).

N-type channel MOSFET 101 configuring semiconductor device 100 includes a first p-type well layer (not shown) and n-type well layer 2 disposed in a surface layer of p-type semiconductor substrate 1, and second p-type well layer 10 formed by diffusion in a surface layer of n-type well layer 2. N-type channel MOSFET 101 includes n-type contact layer 27 formed by diffusion in a surface layer of n-type well layer 2. First p-type well layer 25 is a region for applying potential to p-type semiconductor substrate 1. N-type channel MOSFET 101 includes p-type contact layer 26 formed by diffusion in a surface layer of first p-type well layer 25. Also, first p-type well layer 25 can also be formed as a separation region, formed so as to enclose the outer periphery of n-type well layer 2 and separate n-type well layer 2 from other regions.

N-type channel MOSFET 101 includes first n-type offset layer 16 and second n-type offset layer 17 selectively formed by diffusion to be distanced from each other in a surface layer of second p-type well layer 10. N-type channel MOSFET 101 includes n-type drain layer 22 formed by diffusion in a surface layer of second n-type offset layer 17 and n-type source layer 23 formed by diffusion in a surface layer of first n-type offset layer 16. N-type channel MOSFET 101 includes p-type base layer 21 formed by diffusion, in contact with first n-type offset layer 16 and in contact with second p-type well layer 10, and p-type contact layer 24 formed by diffusion, in contact with p-type base layer 21 and n-type source layer 23.

A LOCOS oxide film (hereafter abbreviated to LOCOS 18) is provided on second n-type offset layer 17, second p-type well layer 10, n-type well layer 2, and p-type semiconductor substrate 1. Thick gate oxide film 19 is disposed on second p-type well layer 10 sandwiched by first n-type offset layer 16 and second n-type offset layer 17, and gate electrode 20 is disposed on thick gate oxide film 19 and LOCOS 18.

Also, n-type channel MOSFET 101 includes interlayer dielectric 28 on the surface of p-type semiconductor substrate 1, and includes drain electrode 29-1 electrically connected to n-type drain layer 22, source electrode 29-2 electrically connected to n-type source layer 23 and p-type contact layer 24, contact electrode 29-3 electrically connected to n-type contact layer 27, and contact electrode 29-4 electrically connected to p-type contact layer 26, wherein second p-type well layer 10 below gate electrode 20 forms a back gate region.

The structure of the invention is such that, as the impurity concentration of region 11 of second p-type well layer 10 below n-type drain layer 22 is formed to be lower than heretofore, a thickness T (the depth from a bottom portion of n-type drain layer 22) of second n-type offset layer 17 shown in FIG. 1B can be widened more than heretofore. As a result of this, depletion layer 30 no longer reaches n-type drain layer 22 when a surge is applied, as shown in FIG. 1C, concentration of an electrical field in this place is prevented, and it is possible to increase ESD resistance.

Also, as a diffusion depth D of one portion of region 11 of second p-type well layer 10 below n-type drain layer 22 is less than a diffusion depth E of region 12 below LOCOS 18, a step C is formed below n-type drain layer 22.

Figure 2A:
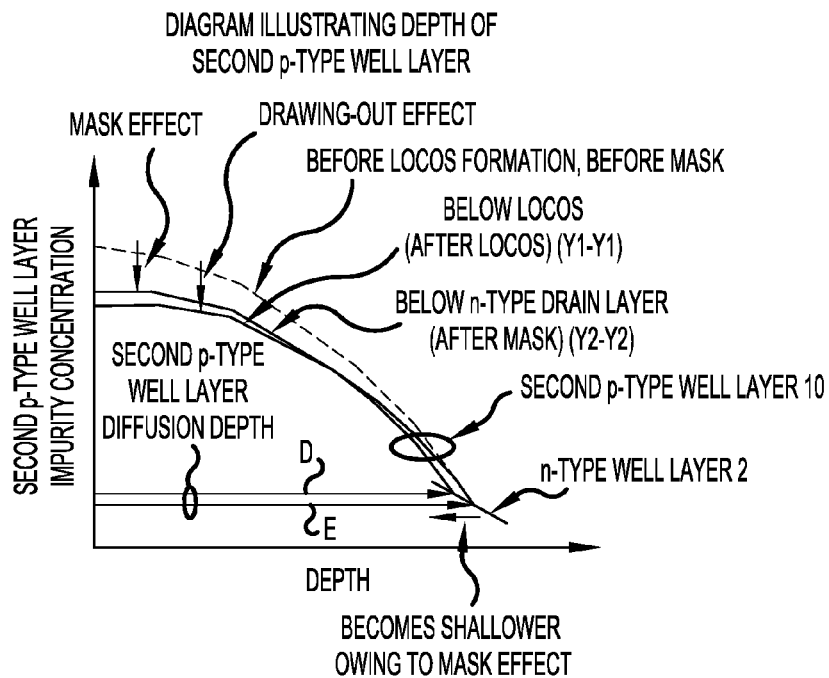
Figure 2B:
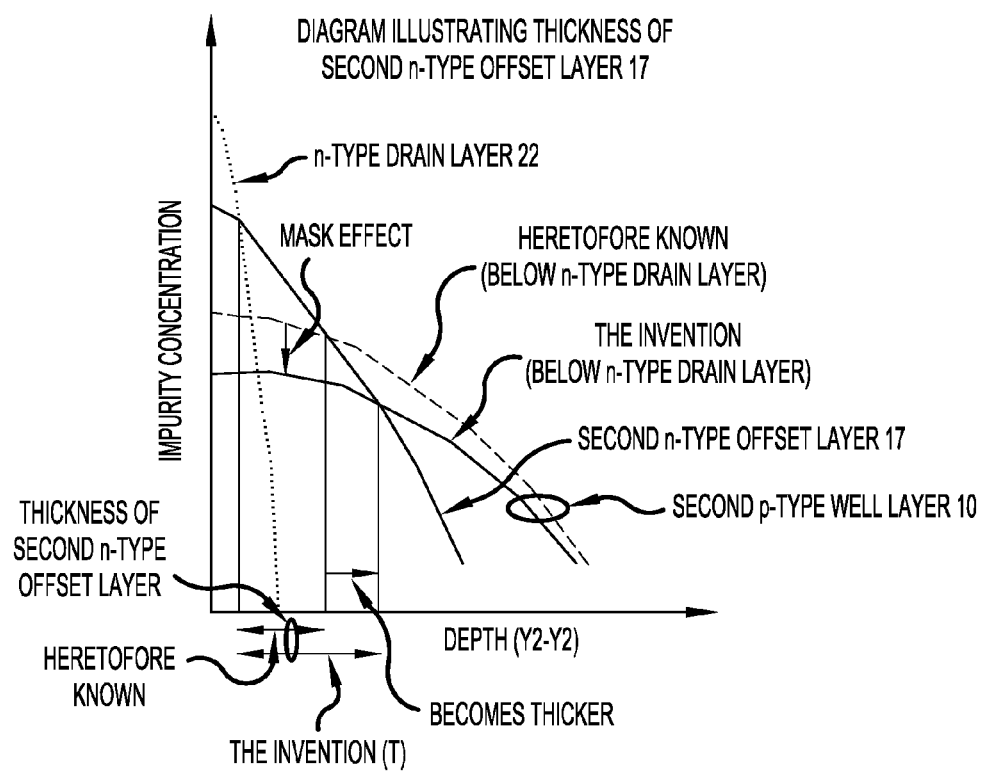

FIGS. 2A and 2B are diagrams showing the relationship between the impurity concentration and depth of each layer along Y1-Y1 and Y2-Y2 of FIG. 1B, wherein FIG. 2A is a diagram illustrating the depth of second p-type well layer 10, and FIG. 2B is a diagram illustrating the thickness T of second n-type offset layer 17.

In FIG. 2A, owing to a mask effect to be described when describing the manufacturing method, the depth of region 11 of second p-type well layer 10 below n-type drain layer 22 is less than depth of region 12 of second p-type well layer 10 below LOCOS 18. Also, the impurity concentration of region 11 of second p-type well layer 10 below n-type drain layer 22 can be brought near to the impurity concentration of region 12 of second p-type well layer 10 below LOCOS 18 in the vicinity of the surface.

In FIG. 2B, as the impurity concentration of region 11 is reduced owing to the mask effect, the thickness T of second n-type offset layer 17 below n-type drain layer 22 can be greater than heretofore. Specifically, as the thickness T of second n-type offset layer 17 can be 0.2 µm or more greater than heretofore, the thickness T of second n-type offset layer 17 can be 0.8 µm or more.

Figure 13:
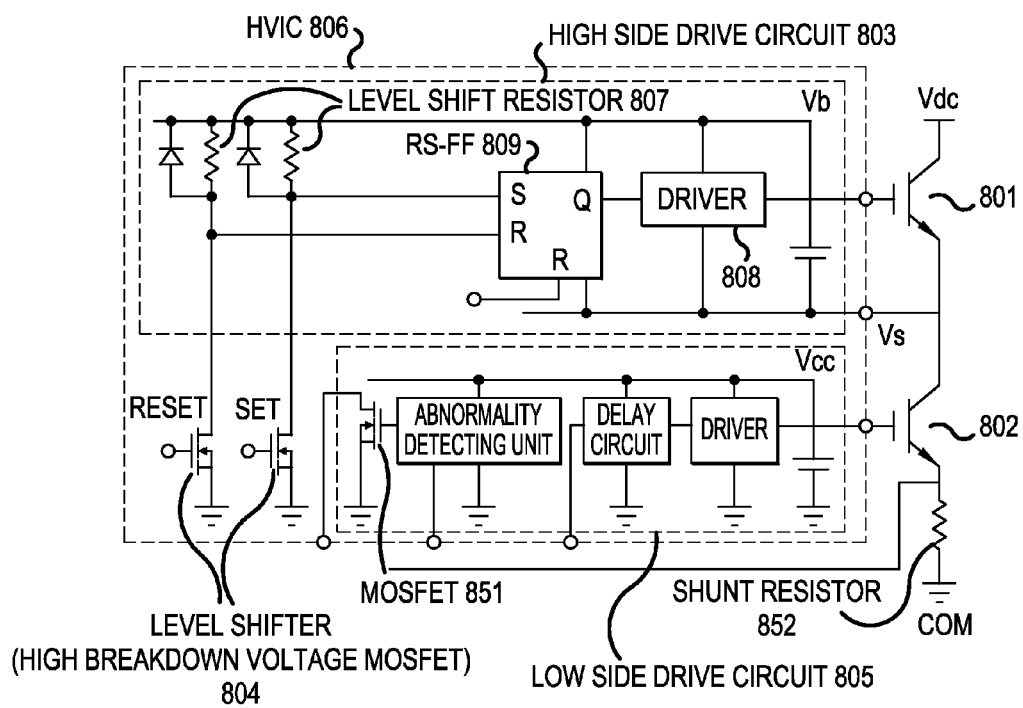
FIG. 13 is a diagram of a general gate drive circuit in a high breakdown voltage IC.

Next, a description will be given of an application example of semiconductor device 100. FIG. 13 is a diagram of a general gate drive circuit in a high breakdown voltage IC. High voltage breakdown IC (HVIC) 806 includes high side drive circuit 803 that operates in accordance with a power supply Vb having as a reference an emitter potential (Vs), which is the main terminal on the low potential side of upper arm IGBT 801. Also, high voltage breakdown IC 806 includes level shifter 804 that transmits a signal from a control circuit (not shown) to high side drive circuit 803. Furthermore, high voltage breakdown IC 806 includes low side drive circuit 805 that receives a signal from the control circuit, thereby driving lower arm IGBT 802, and operates in accordance with a power supply Vcc having as a reference an emitter potential (COM), which is the main terminal on the low potential side of lower arm IGBT 802. The structure is such that level shift resistor 807 is connected to level shifter 804 and, by current flowing through level shift resistor 807 being controlled by level shifter 804, a signal from the control circuit is transmitted to high side drive circuit 803.

In order to reduce power loss in level shifter 804, it is usual to include two level shifters 804, one each for setting (ON) and resetting (OFF). Normally, a high breakdown voltage MOSFET is used for level shifter 804. As it is necessary that the high breakdown voltage IC can withstand an overvoltage generated in accompaniment to a turning on or off of an IGBT, or the like, a breakdown voltage of 600V or more is required in the case of a 200V AC inverter, and a breakdown voltage of 1,200V or more in the case of a 400V AC inverter.

A ground potential is normally connected to the COM terminal, Vdc is a high voltage power supply of 100V or more with COM as a reference, and Vb is a low voltage power supply of in the region of 15V to 30V with Vs (floating potential) as a reference. Also Vcc is a low voltage power supply of in the region of 15V to 30V with COM as a reference.

N-type channel MOSFET 101 of the invention can be applied to high side driver 808 and RS-FF 809 shown in FIG. 13, and an n-type channel MOSFET (not shown) configuring a driver of low side drive circuit 805. Also, n-type channel MOSFET 101 of the invention can be applied to MOSFET 851. When MOSFET 851 detects an abnormal current with an abnormality detecting unit connected to the high potential side of shunt resistor 852 connected to the emitter of IGBT 802, a turn-on signal is applied to the gate of MOSFET 851, and MOSFET 851 outputs an abnormality signal to an external control circuit (not shown).

Figure 14A:
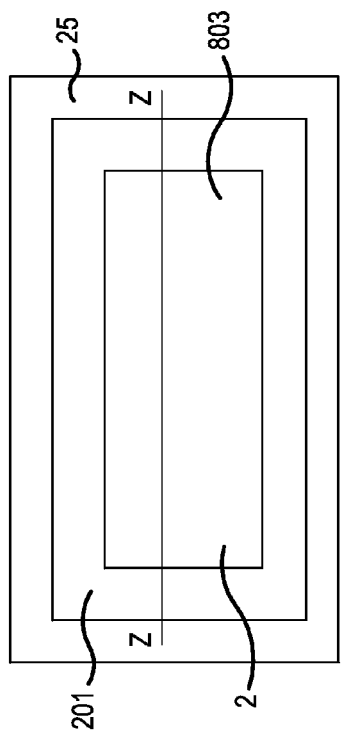
Figure 14B:
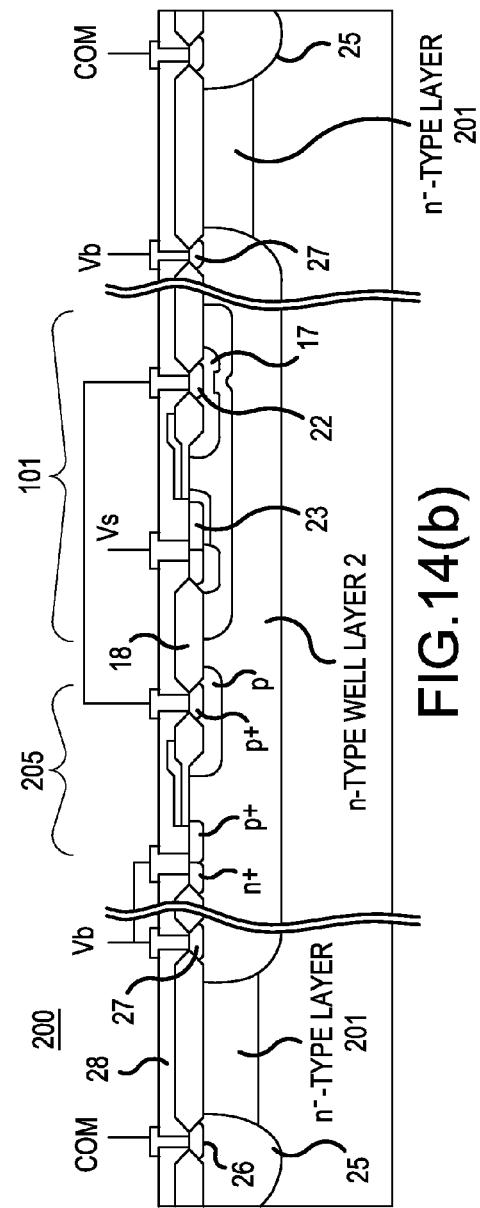

FIGS. 14A and 14B are diagrams showing an example of semiconductor device 200 including n-type channel MOSFET 101 configuring high side drive circuit 803 shown in FIG. 13, wherein FIG. 14A is a main portion plan view, and FIG. 14B is a main portion sectional view along line Z-Z of FIG. 14A.

P-type channel MOSFET 205, not shown in semiconductor device 100, is shown in semiconductor device 200. Also, first p-type well layer 25 is formed so as to enclose n-type well layer 2. Furthermore, unlike semiconductor device 100 shown in FIGS. 1A to 1C, n⁻ type layer 201 with an impurity concentration lower than that of n-type well layer 2 is formed between n-type well layer 2 and first p-type well layer 25, and employed as a voltage withstanding region. Without forming n⁻ type layer 201, an outer peripheral portion of n-type well layer 2 may be employed as a voltage withstanding region by not forming a circuit therein. N-type channel MOSFET 101 is the same as in semiconductor substrate 100.

High side drive circuit 803 shown in FIG. 13 is formed in n-type well layer 2. N-type channel MOSFET 101 shown in FIGS. 14A and 14B configures a CMOS circuit together with p-type channel MOSFET 205. The CMOS circuit configures driver 808 of FIG. 13.

In the case of semiconductor device 200 configuring high side drive circuit 803, p-type semiconductor substrate 1 is electrically connected to the ground via first p-type well layer 25 and p-type contact layer 26. N-type well layer 2 is electrically connected to Vb via n-type contact layer 27, and second p-type well layer 10 is electrically connected together with n-type source layer 23 to Vs via p-type base layer 21 and p-type contact layer 24. N-type drain layer 22 is connected to the drain of a p-type channel MOSFET, whose source is connected to Vb. Also, one portion of n-type channel MOSFET 101 formed in driver 808, as shown in FIGS. 14A and 14B, is such that n-type drain layer 22 is electrically connected to the gate of IGBT 801.

Figure 3:
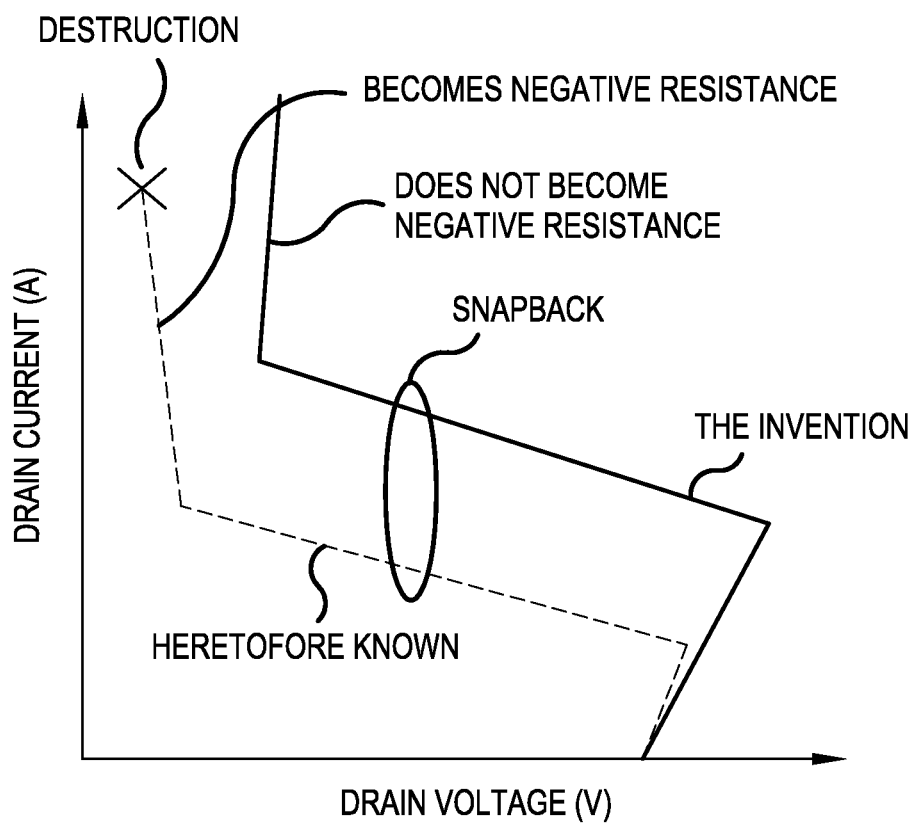
FIG. 3 is a diagram showing the relationship between the drain voltage and drain current of an n-type channel MOSFET 101 when an ESD surge is input into the drain of the high side structure n-type channel MOSFET 101 configuring the semiconductor device 100.

FIG. 3 is a diagram showing the relationship between the drain voltage and drain current of n-type channel MOSFET 101 when an ESD surge is input into the drain in a case in which n-type channel MOSFET 101 configures the kind of high side drive circuit 803 shown in FIGS. 14A and 14B. The diagram shows the appearance of a snapback waveform after avalanche breakdown compared with one heretofore known (dotted line).

N-type channel MOSFET 101 shown in FIGS. 1A to 1C is such that, as the thickness T of second n-type offset layer 17 below n-type drain layer 22 is large, an electrical field in a junction portion of second n-type offset layer 17 and region 11 is alleviated, and the breakdown voltage increases in comparison with that heretofore known. Furthermore, as second n-type offset layer 17 below n-type drain layer 22 functions as a resistance component without becoming completely depleted (without depletion layer 30 spreading over the whole region), as shown in FIG. 1C, second n-type offset layer 17 does not become a negative resistor after snapback, and there is no occurrence of localized current concentration. Because of this, the ESD resistance is dramatically increased.

In this way, when an ESD surge is applied to n-type drain layer 22, depletion layer 30 in second n-type offset layer 17 does not reach n-type drain layer 22 at a low voltage, and it is possible to prevent thermal destruction caused by a localized electrical field concentration.

Example 2

FIGS. 4A to 6H are main portion manufacturing step sectional views of semiconductor device 100 manufacturing method, shown in step order, according to a second example of the invention. Herein, a description will be given of a method of manufacturing n-type channel MOSFET 101 configuring semiconductor device 100.

Figure 4A:
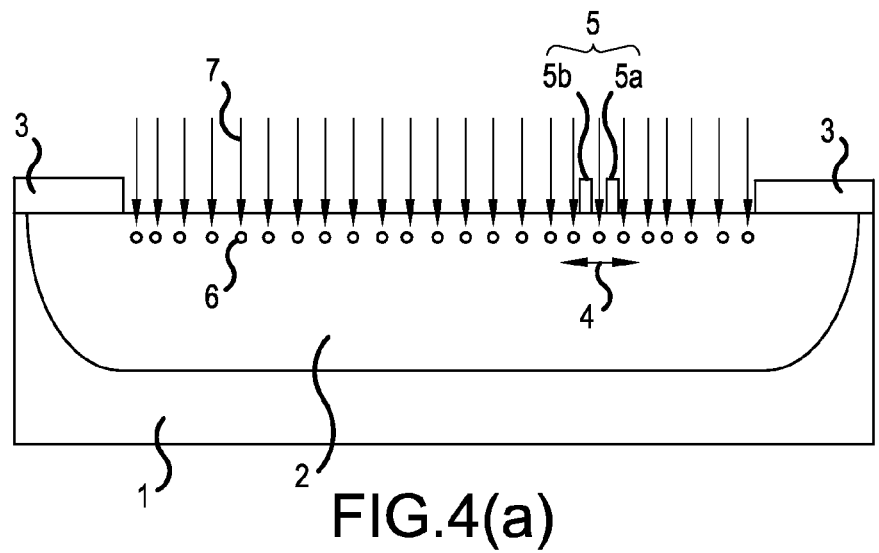
FIGS. 4A to 4C are main portion manufacturing step sectional views of the semiconductor device 100 according to a second example of the invention.

In FIG. 4A, n-type well layer 2 and the not shown first p-type well layer 25 are formed on the p-type semiconductor substrate 1. Second p-type well layer 10 is formed as a back gate region on n-type well layer 2. Also, there is a case in which n-type well layer 2 and first p-type well layer 25 are both formed by diffusion, and a case in which one of the wells is formed as an epitaxial layer. For example, when forming n-type well layer 2 as an epitaxial layer, an n-type epitaxial layer is formed on p-type semiconductor substrate 1, after which first p-type well layer 25 is formed by diffusion to a depth from the surface of the n-type epitaxial layer reaching p-type semiconductor substrate 1. The planar form of first p-type well layer 25 is formed in a ring-form, and a region enclosed by first p-type well layer 25 is taken to be n-type well layer 2.

In the process of forming these layers, photoresist mask 3 for forming second p-type well layer 10 is formed on a buffer oxide film (not shown). Photoresist mask 3 has slit mask 5 having slit form opening portion 5a and non-opening portion 5b in place 4 in which n-type drain layer 22 is due to be formed. Photoresist mask 3 having slit mask 5 acts as a mask when carrying out ion implantation 7 of boron impurities 6. A heretofore known photoresist mask is such that only opening portion 5a is formed, while slit form non-opening portion 5b is not formed. After photoresist mask 3 having slit mask 5 is deposited, ion implantation 7 of boron impurities 6 is carried out to lower the boron concentration of region 11 below n-type drain layer 22 in order to increase the thickness T of second n-type offset layer 17. As a result of this, the boron concentration of region 11 below n-type drain layer 22 nears the boron concentration of region 12 below LOCOS 18, which is reduced by out-diffusion when forming LOCOS 18.

Figure 8A:
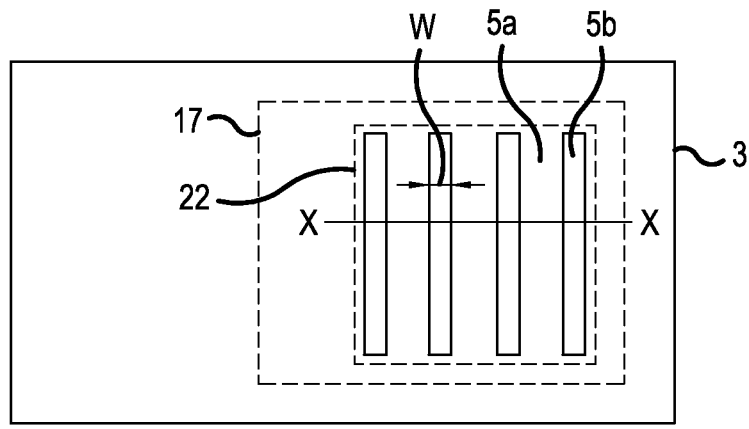
Figure 8B:
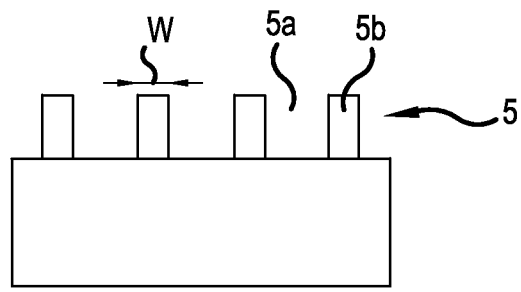
Figure 8C:
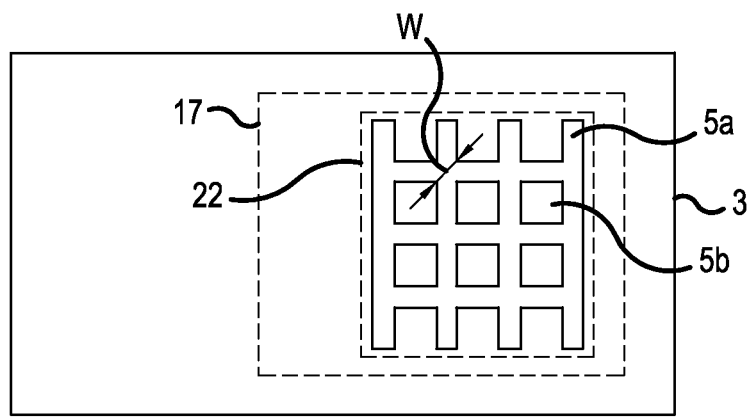

Continuing, ion implantation 7 of boron impurities 6 is carried out in order to form second p-type well layer 10 using photoresist mask 3. FIGS. 8A to 8C are diagrams of slit mask 5 of photoresist mask 3 used at this time, wherein FIG. 8A is a plan view of slit mask 5 wherein both opening portion 5a and non-opening portion 5b are of a stripe form, FIG. 8B is a sectional view cut along a line X-X of FIG. 8A, and FIG. 8C is a plan view of slit mask 5 wherein non-opening portion 5b is of a lattice form and opening portion 5a of a quadrilateral form. Of course, the planar form of photoresist mask 3 is not limited to this. However, it is necessary that a width W of non-opening portion 5b is less than two times greater the lateral diffusion distance of boron impurities 6. This is because in the event that the width W is two times or more the lateral diffusion distance, two p-type diffusion layers spread by lateral diffusion will not join together, n-type well layer 2 will be in contact with second n-type offset layer 17, and it will no longer be possible to maintain breakdown voltage in this place.

Figure 4B:
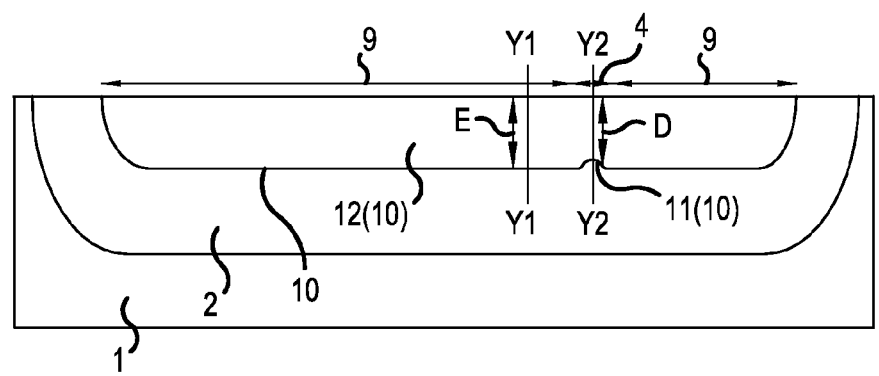
Figure 7A:
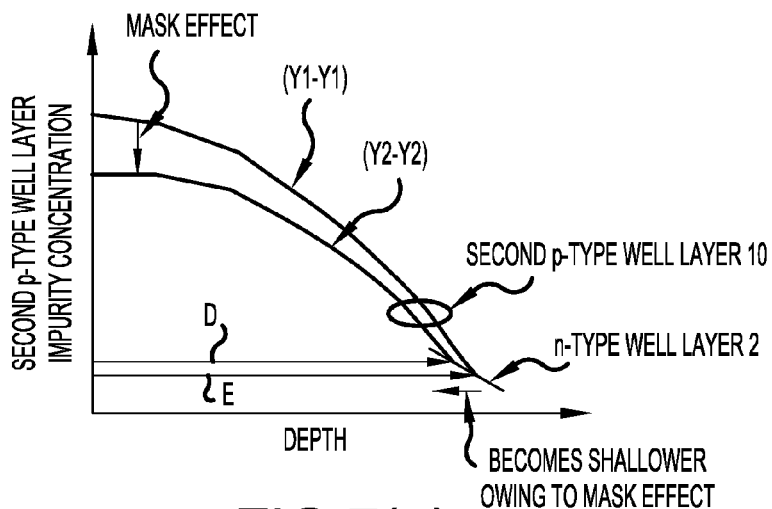

Next, in FIG. 4B, boron impurities 6 implanted by ion implantation 7 via photoresist mask 3 into n-type well layer 2 using a high temperature drive-in process spread by lateral diffusion, and join together to form second p-type well layer 10. However, owing to the effect of slit mask 5, the concentration of ion implanted boron impurities 6 is low in place 4 in which n-type drain layer 22 is due to be formed. Because of this, the impurity concentration of second p-type well layer 10 formed after the high temperature drive-in process is low in region 11 from the surface to a bottom portion of place 4 in which n-type drain layer 22 is due to be formed compared with that in region 12 from the surface to a bottom portion of another place 9. Also, the diffusion depth D of region 11 is small in comparison with the diffusion depth E of region 12. The relationship between the impurity concentration and diffusion depth is shown in FIG. 7A. The impurity concentration and diffusion depth D of second p-type well layer 10 along Y2-Y2 can be varied by changing the non-opening ratio of slit mask 5 (=(area of non-opening portion 5b/(area of non-opening portion 5b+area of opening portion 5a))×100(%): shielding ratio). For example, when increasing the non-opening ratio from 0% (a heretofore known manufacturing method using an opening ratio of 100%), the impurity concentration of second p-type well layer 10 along the line Y2-Y2 decreases, and the diffusion depth D decreases.

Figure 4C:
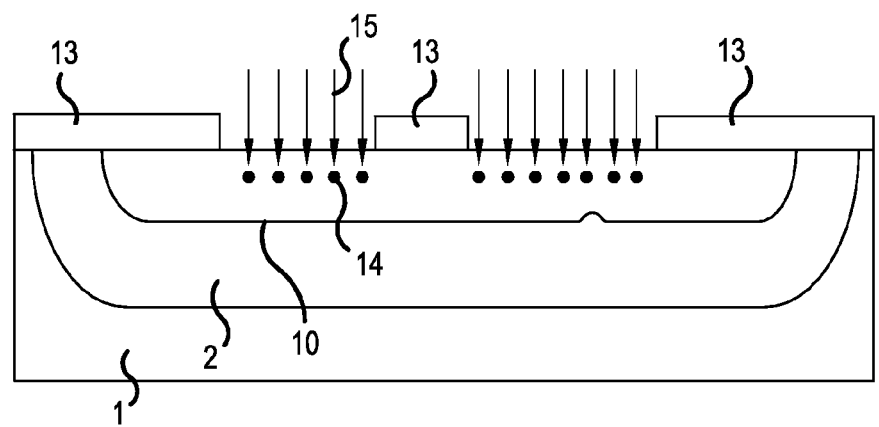
Figure 5D:
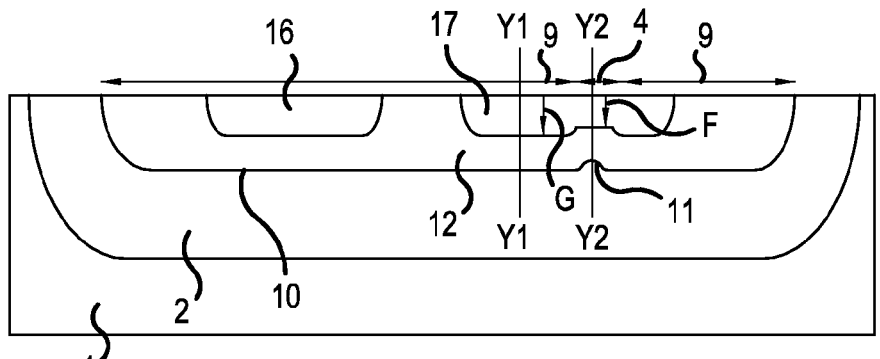
FIGS. 5D to 5F, continuing from FIGS. 4A to 4C, are main portion manufacturing step sectional views of the semiconductor device 100 according to the second example of the invention.
Figure 7B:
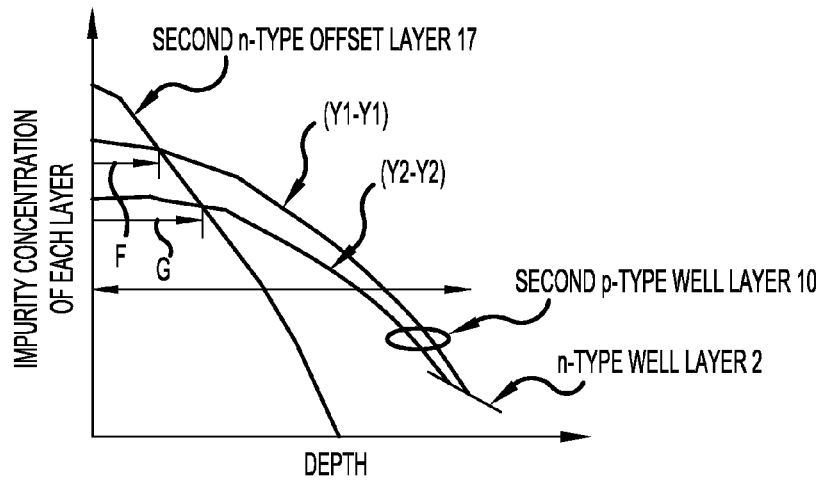

In FIG. 4C, ion implantation 15 of phosphorus impurities 14 is carried out in order to form the source side first n-type offset layer 16 and drain side second n-type offset layer 17 distanced on second p-type well layer 10, using photoresist mask 13. In FIG. 5D, the source side first n-type offset layer 16 and drain side second n-type offset layer 17 are formed in a surface layer of second p-type well layer 10 by a high temperature drive-in process. As the impurity concentration of region 11 is high with respect to the impurity concentration of region 12 on the side of second p-type well layer 10 on which second n-type offset layer 17 is formed, a diffusion depth F of second n-type offset layer 17 in place 4 in which n-type drain layer 22 is due to be formed is small compared to a diffusion depth G of other place 9. The relationship between the impurity concentration and depth is shown in FIG. 7B.

Figure 5E:
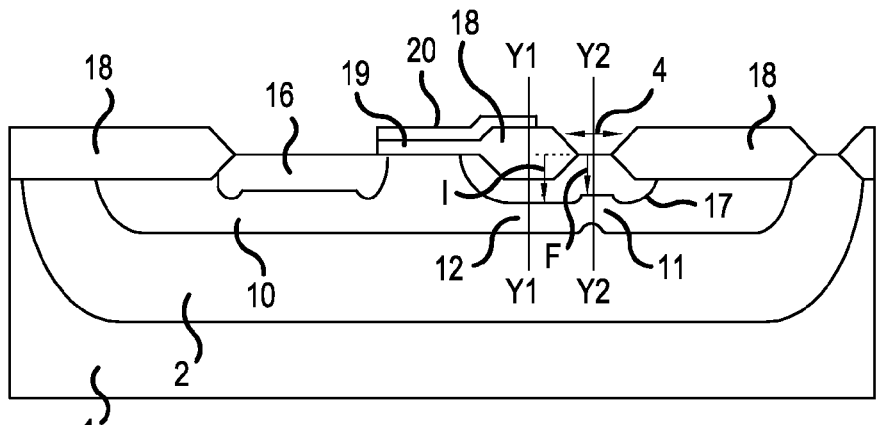
Figure 7C:
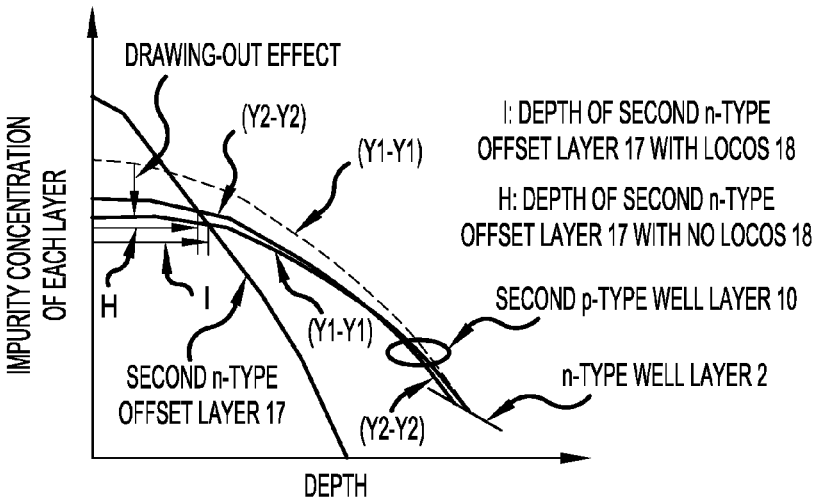

In FIG. 5E, LOCOS 18 is formed by pyro-oxidation, thick gate oxide film 19 linking with LOCOS 18 is formed, and gate electrode 20 is formed of polysilicon on thick gate oxide film 19. In this step, the impurity concentration of second p-type well layer 10 along Y1-Y1 is such that the dotted line Y1-Y1 of FIG. 7C before the formation of LOCOS 18 decreases like the solid line Y1-Y1 of FIG. 7C after the formation of LOCOS 18, as shown in FIG. 7C. Meanwhile, the impurity concentration along Y2-Y2 in place 4 in which n-type drain layer 22 is due to be formed, on which LOCOS 18 is not formed, does not decrease (it is the same as Y2-Y2 of FIG. 7A). As a result of this, it is possible, by non-opening portion 5b of slit mask 5 being of a predetermined size, to bring the boron concentration of region 12 below LOCOS 18 (the solid line Y1-Y1 of FIG. 7C) near to the boron concentration of region 11 in the place on which LOCOS 18 is not formed (Y2-Y2 of FIG. 7C). At the stage at which this step ends, a depth H of second n-type offset layer 17 in the place on which there is no LOCOS (Y2-Y2 of the drawings) nears a depth I of second n-type offset layer 17 in the place on which LOCOS 18 exists (Y1-Y1 of FIG. 7C).

Figure 5F:
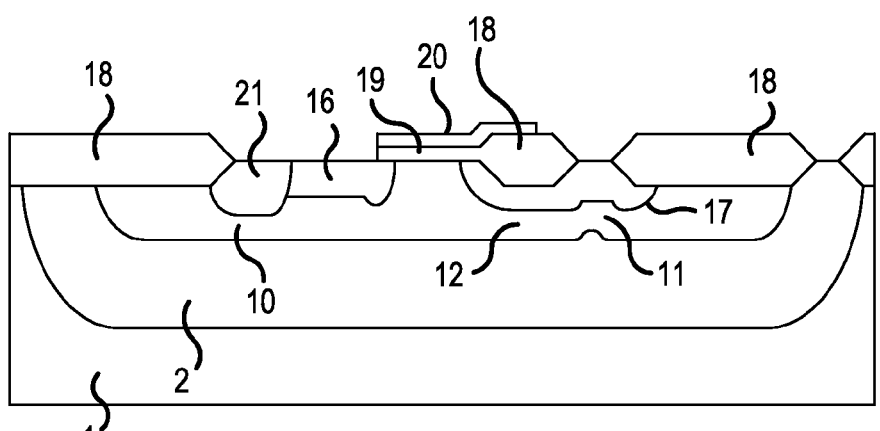
Figure 6G:
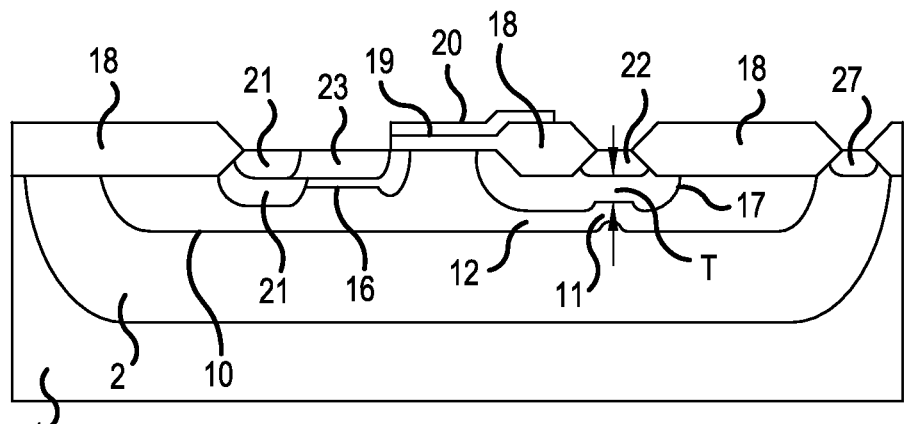
FIGS. 6G and 6H, continuing from FIGS. 5D to 5F, are main portion manufacturing step sectional views of the semiconductor device 100 according to the second example of the invention.

In FIG. 5F, p-type base layer 21, which forms a contact layer of second p-type well layer 10, is formed using LOCOS 18 and a photoresist mask (not shown). In FIG. 6G, with LOCOS 18 and the not shown photoresist as a mask, n-type drain layer 22 is formed in a surface layer of second n-type offset layer 17, n-type source layer 23 in a surface layer of first n-type offset layer 16, and n-type contact layer 27 in a surface layer of n-type well layer 2, by an arsenic impurity ion implantation step and an annealing processing step. At this stage, the thickness T of second n-type offset layer 17 below n-type drain layer 22 is reduced by the formation of n-type drain layer 22. However, as will be described hereafter, the thickness T of second n-type offset layer 17 below n-type drain layer 22 is large in comparison with that in a heretofore known structure. Also, p-type contact layer 24 connected to p-type base layer 21 and the not shown p-type contact layer 26 in a surface layer of the not shown first p-type well layer 25 are formed using LOCOS 18 and a photoresist mask (not shown).

As previously described, the thickness T of second n-type offset layer 17 below n-type drain layer 22 can be thicker than heretofore by bringing the boron concentration of region 11 below n-type drain layer 22 near to the boron concentration of region 12 below LOCOS 18. As a result of this, there is no longer an electrical field concentration below th n-type drain layer 22 when an ESD surge is applied to the drain of n-type channel MOSFET 101, as previously described, destruction due to local heat generation after avalanche is suppressed, and it is thus possible to increase ESD resistance.

Figure 6H:
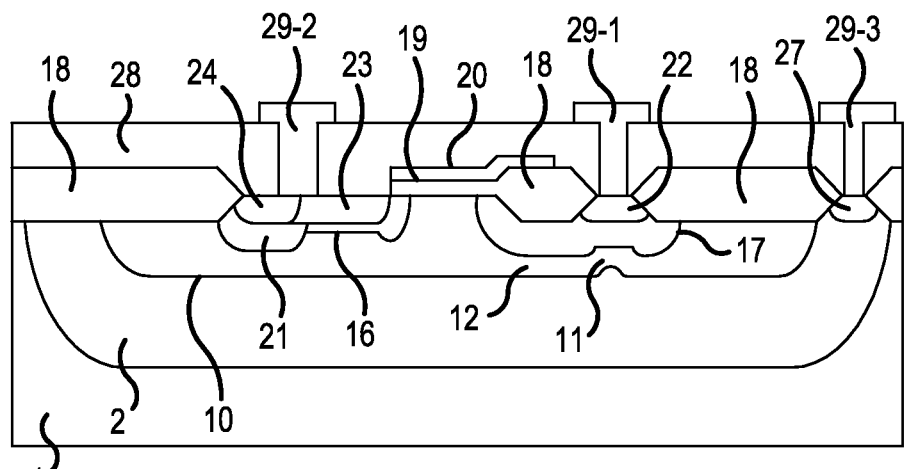

Next, as shown in FIG. 6H, interlayer dielectric 28 is formed, after which drain electrode 29-1, source electrode 29-2, contact electrode 29-3, and not shown contact electrode 29-4 are formed. The fabricating of the n-type channel MOSFET is completed by these steps.

Figure 10A:
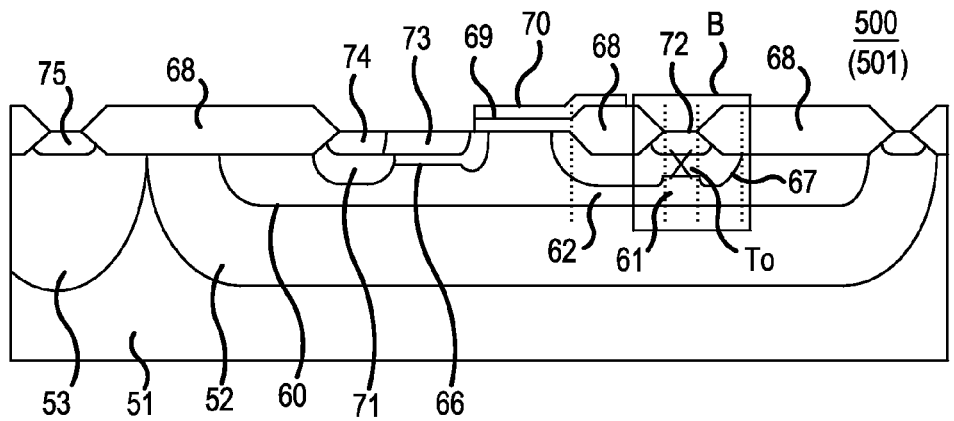
Figure 10B:
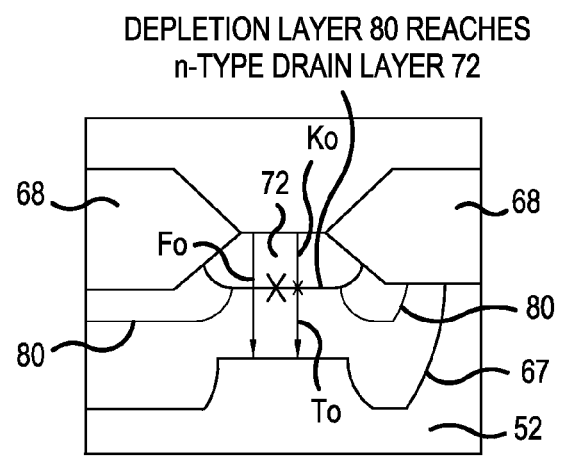
Figure 11A:
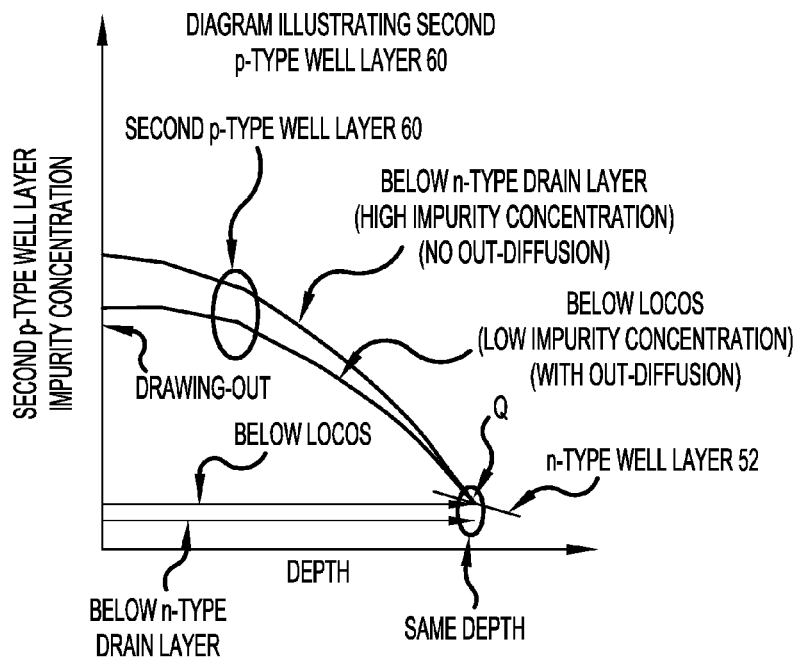
Figure 11B:
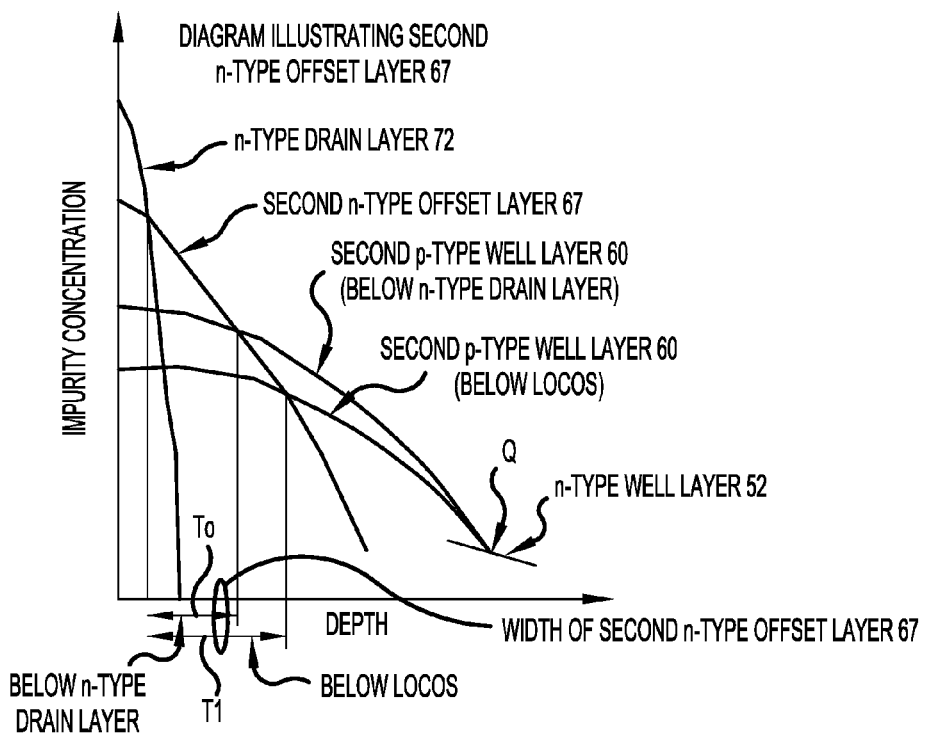
Figure 12:
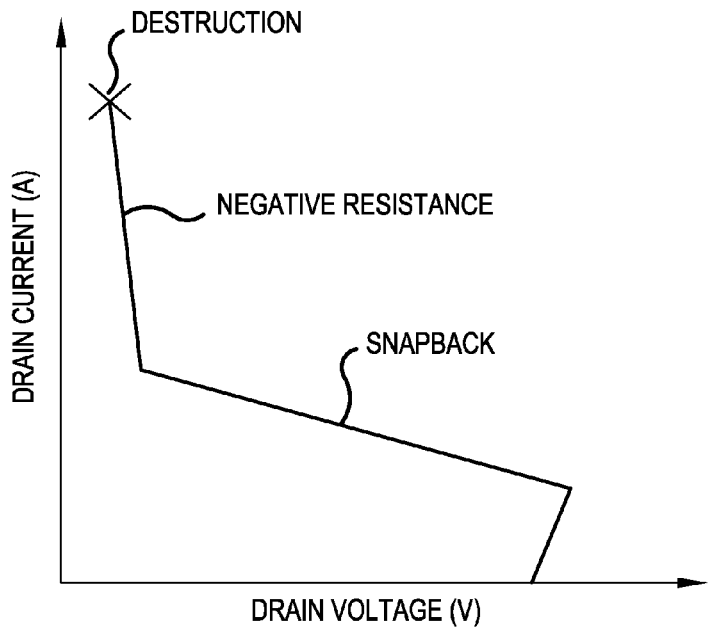
FIG. 12 is a diagram showing the relationship between the drain voltage and drain current when an ESD surge is input into the drain of an n-type channel MOSFET 501 with a heretofore known high side structure.

Next, a description will be given, with specific examples, of data on each layer formed in the previously described steps. Taking the diffusion depth of second n-type offset layer 17, which is a drain drift region of n-type channel MOSFET 101 below n-type drain layer 22, to be F, and the diffusion depth of n-type drain layer 22 to be K, the thickness T of second n-type offset layer 17 is F-K. In a heretofore known structure, taking the diffusion depth of second n-type offset layer 67 to be Fo, the diffusion depth of n-type drain layer 72 to be Ko, and the thickness of second n-type offset layer 17 to be To, Fo=1.0 μm and Ko=0.4 μm, meaning that To is thin at 0.6 μm, as shown in FIG. 10B.

The invention is such that second p-type well layer 10 is formed by an ion implantation of boron impurities using slit mask 5. In a subsequent drive-in step, slit form diffusion layers are joined together by a lateral diffusion of the boron impurities, thereby forming second p-type well layer 10. Because of this, the boron concentration of region 11 decreases. Also, second p-type well layer 10 includes a region wherein the diffusion depth D of region 11 is small compared with the diffusion depth E of region 12. By forming second n-type offset layer 17 in a surface layer of second p-type well layer 10 including region 11 in which the boron concentration is low, and furthermore, by forming n-type drain layer 22, the thickness T (=F−K) of second n-type offset layer 17 below n-type drain layer 22 can be formed to be greater than that of the heretofore known structure at 0.8 to 1.0 μm. That is, the thickness T of second n-type offset layer 17 can be 0.2 μm to 0.4 μm greater than that of the heretofore known structure (To=0.6 μm). As a result of this, it is possible to achieve an increase in ESD resistance, as previously described. Also, as previously described, it is possible to increase the thickness T of second n-type offset layer 17 below n-type drain layer 22 by increasing the non-opening ratio of slit mask 5.

However, when the non-opening ratio is increased too far, the impurity concentration of region 11 drops to or below the impurity concentration of n-type well layer 2. That is, region 11 changes to an n-type, and n-type well layer 2 and second n-type offset layer 17 join together, causing the ESD resistance to decrease remarkably. Because of this, it is desirable that the non-opening portion ratio is in the region of 50%.

Also, when increasing the width of non-opening portion 5b (the non-opening portion width W), the place in which two diffusion layers formed by a lateral diffusion of the boron impurities overlap becomes narrower. Because of this, the boron concentration of second p-type well layer 10 in the place in which the diffusion layers overlap decreases too far, and second n-type offset layer 17 formed subsequently joins n-type well layer 2, meaning that a good second n-type offset layer 17 is not formed. As a result of this, the ESD resistance decreases remarkably.

Next, a description will be given of the non-opening portion width W of slit mask 5. Taking the diffusion depth D of region 11 to be 4.0 μm, there is diffusion in the lateral direction of 3.2 μm, as the lateral diffusion is a diffusion in the region of 80% of the diffusion depth. Because of this, it is necessary to set the non-opening portion width W to 3.2 μm×2=6.4 μm or less in order that the diffusion layers are joined together by lateral diffusion using heat treatment.

From the above, it is necessary that W≤D×0.8×2.

Figure 9:
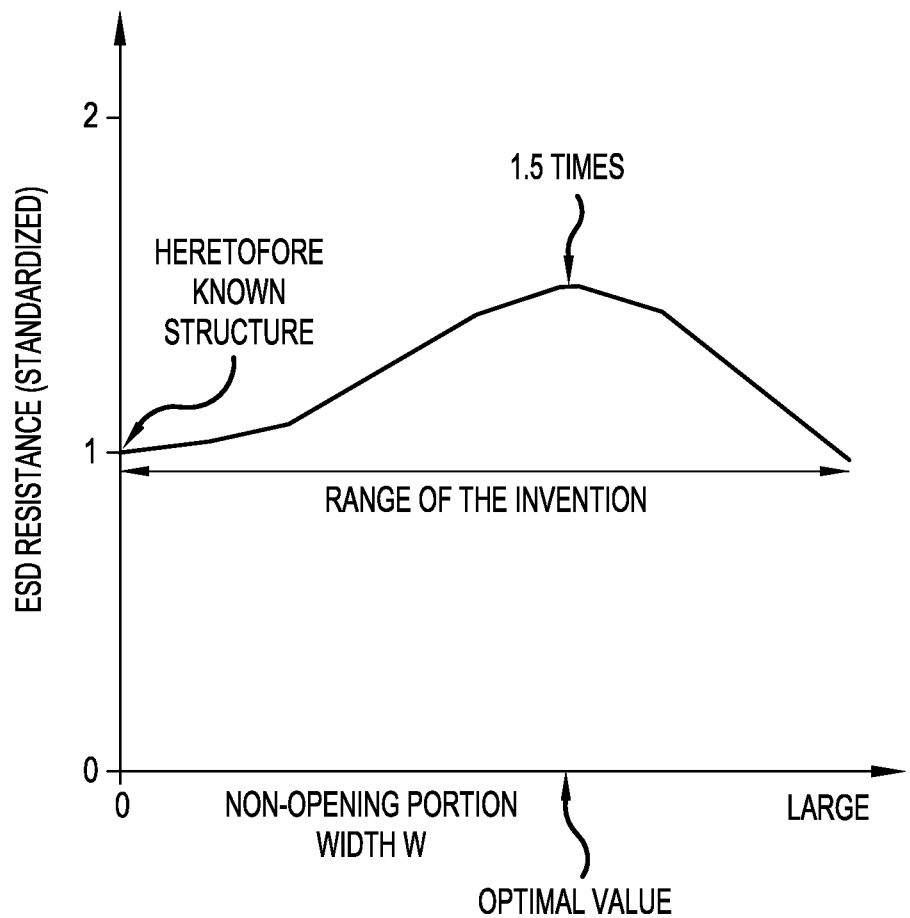
FIG. 9 is a diagram illustrating the relationship between ESD resistance and a width W of the non-opening portion 5b.

FIG. 9 is a diagram illustrating the relationship between the ESD resistance and the non-opening portion width W of slit mask 5. The horizontal axis is the non-opening portion width W (arbitrary scale), while the vertical axis is the ESD resistance with a heretofore known structure as a reference. Consequently, the value of the vertical axis is the value when the ESD resistance of the heretofore known structure is 1.

As previously described, slit mask 5 has the slit form (stripe form) opening portion 5a and non-opening portion 5b sandwiched by opening portion 5a in a case such as that in FIG. 8A. When the non-opening portion width W is zero, there is no slit form opening portion 5a, and slit mask 5 covering place 4 in which n-type drain layer 22 is due to be formed is opened over the whole region. When the non-opening portion width W is increased, the impurity concentration of region 11 decreases. Because of this, the width T of second n-type offset layer 17 increases. As a result of this, the ESD resistance increases. However, when the non-opening portion width W increases too far, the place in which the diffusion layers overlap in the drive-in step becomes narrower, and the ESD resistance decreases. When the non-opening portion width W further increases, there is no place in which the diffusion layers overlap, region 11 is divided, it becomes difficult to maintain breakdown voltage, and the ESD resistance decreases remarkably.

From the above, it is seen that the ESD resistance has a peak value with respect to the non-opening portion width W, as shown in FIG. 9. As a result of this, it is necessary to set a range of the non-opening portion width W such that the ESD resistance is higher than the heretofore known ESD resistance. Also, by adopting an optimal non-opening portion width W, it is possible to increase the ESD resistance in the structure of the invention to as far as in the region of 1.5 times the ESD resistance of the heretofore known structure. Consequently, the invention is such that the range of the non-opening portion width W is a range larger than the ESD resistance of the heretofore known structure.

According to the invention, it is possible for second n-type offset layer 17 below n-type drain layer 22 on the drain side of high side n-type channel MOSFET 101 to be formed sufficiently thickly, because of which, depletion layer 30 does not reach n-type drain layer 22 at a low voltage even when an ESD surge is applied to the drain, and second n-type offset layer 17 functions as a resistance component. Because of this, it is unlikely that a localized current concentration will occur after avalanche. This is because n-type channel MOSFET 101 is configured of a large number of MOSFET cells, and it is possible to cause an avalanche current to flow evenly through a junction portion (a junction between second p-type well layer 10 and second n-type offset layer 17) on the drain side of each MOSFET cell owing to the resistance component. Furthermore, this is also because, as the resistance component does not become a negative resistor, localized heat generation is suppressed.

The invention is such that, as the heretofore known photoresist mask is changed to photoresist mask 3 having slit mask 5, and each process is the same as heretofore, there is no increase in the number of processes. Also, as the ESD resistance of n-type channel MOSFET 101 increases owing to the ESD resistance of the n-type channel MOSFET being increased as far as in the region of 1.5 times by adjusting the non-opening portion width W of slit mask 5, there is no need to carry out an addition of protective elements, an increase of an active region (a region through which the main current flows) in order to maintain resistance, or the like. Because of this, it is possible to reduce the chip size.

To summarize the above, the invention is such that it is possible to provide a semiconductor device and manufacturing method thereof wherein it is possible to prevent thermal destruction caused by a localized electrical field concentration, suppress an increase in the number of processes, and increase the ESD resistance of n-type channel MOSFET 101, and thus possible to reduce the size of the chip. Also, as well as n-type channel MOSFET 101 configuring semiconductor device 100 (for example, a high breakdown voltage IC), the invention can also be applied to a semiconductor element (device) used with a high side potential as a reference rather than being used with a ground potential as a reference.

Thus, a semiconductor device and its manufacturing method have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device, comprising:
a second conductivity type well layer disposed on or in a surface layer of a first conductivity type semiconductor substrate;
a first conductivity type second well layer selectively disposed in a surface layer of the second conductivity type well layer;
a second conductivity type first offset layer and second conductivity type second offset layer spaced apart in a surface layer of the first conductivity type second well layer;
a second conductivity type high concentration layer, with an impurity concentration higher than that of the second offset layer, disposed in a surface layer of the second offset layer; and
a LOCOS oxide film disposed so as to enclose the high concentration layer, wherein
the diffusion depth of the second well layer below the high concentration layer is less than the diffusion depth of the second well layer below the LOCOS oxide film.

2. The semiconductor device according to claim 1, wherein the thickness of the second offset layer between the second well layer and high concentration drain layer is 0.8 µm or more.

3. A semiconductor device, comprising:
a first conductivity type well layer and second conductivity type well layer disposed on a first conductivity type semiconductor substrate;
a first conductivity type second well layer selectively disposed in a surface layer of the second conductivity type well layer;
a second conductivity type first offset layer and second conductivity type second offset layer spaced apart in a surface layer of the first conductivity type second well layer;
a second conductivity type source layer disposed in a surface layer of the first offset layer;
a second conductivity type drain layer disposed in a surface layer of the second offset layer;
a first conductivity type semiconductor layer disposed in contact with the source layer in a surface layer of the second well layer on the side opposite to that of the second offset layer;
a gate electrode disposed across a gate dielectric on the second well layer sandwiched by the first offset layer and second offset layer; and
a LOCOS oxide film, disposed so as to enclose the drain layer, disposed in contact with the gate dielectric, wherein
the second well layer is such that a bottom portion below the high concentration drain layer includes a region shallower than a bottom portion below the LOCOS oxide film.

4. The semiconductor device according to claim 2, wherein the thickness of the second offset layer between the second well layer and high concentration drain layer is 0.8 µm or more.

5. A method of manufacturing a semiconductor device including a first conductivity type well layer and second conductivity type well layer disposed on a first conductivity type semiconductor substrate and a first conductivity type second well layer selectively disposed in a surface layer of the second conductivity type well layer, the manufacturing method comprising:

a step of forming the first conductivity type well layer and second conductivity type well layer on or in a surface layer of the first conductivity type semiconductor substrate;

a step of ion implanting first conductivity type impurities using a photoresist mask including a first opening portion and a second opening portion enclosed by the first opening portion or formed so as to divide the first opening portion, and subsequently carrying out a drive-in process, thereby forming the second well layer including a region wherein the depth of a region corresponding to the second opening portion is less than the depth of a region corresponding to the first opening portion;

a step of forming a second conductivity type first offset layer in a surface layer of the second well layer;

a step of forming a second conductivity type second offset layer distanced from the first offset layer on a region of the second well layer with a small depth;

a step of forming a LOCOS oxide film including a third opening portion on the second offset layer;

a step of forming a gate dielectric so as to be in contact with the LOCOS oxide film on the second well layer sandwiched by the first offset layer and second offset layer and on the second offset layer;

a step of forming a gate electrode on the gate dielectric;

a step of forming a second conductivity type source layer in a surface layer of the first offset layer;

a step of ion implanting second conductivity type impurities into a surface layer of the second offset layer with the LOCOS oxide film as a mask, and carrying out a drive-in process, thereby forming a second conductivity type drain layer;

a step of forming a first conductivity type semiconductor layer in contact with the second well layer from the first offset layer surface; and a step of forming a source electrode electrically connected to the source layer and semiconductor layer and a drain electrode electrically connected to the drain layer.

6. The semiconductor device manufacturing method according to claim 5, wherein the impurities are boron.

7. The semiconductor device manufacturing method according to claim 5, wherein the area of the second opening portion is regulated so as to bring the impurity concentration of the second well layer below the drain layer near to the impurity concentration of the second well layer below the LOCOS oxide film.

8. The semiconductor device manufacturing method according to claim 5, wherein he first offset layer and second offset layer are formed simultaneously by an ion implantation of phosphorus impurities and a drive-in process.

9. The semiconductor device manufacturing method according to claim 5, wherein he first conductivity type well layer or second conductivity type well layer is formed of an epitaxial layer, while the second conductivity type well layer or first conductivity type well layer is formed by diffusion.

* * * * *